(12) United States Patent
Mabuchi

(10) Patent No.: US 10,136,081 B2
(45) Date of Patent: Nov. 20, 2018

(54) SOLID-STATE IMAGING ELEMENT WITH LATCH CIRCUITS AND ELECTRONIC DEVICE EQUIPPED WITH THE SAME

(71) Applicant: Sony Corporation, Tokyo (JP)

(72) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/371,615

(22) PCT Filed: Jan. 11, 2013

(86) PCT No.: PCT/JP2013/050407
§ 371 (c)(1),
(2) Date: Jul. 10, 2014

(87) PCT Pub. No.: WO2013/111629
PCT Pub. Date: Aug. 1, 2013

(65) Prior Publication Data
US 2014/0327802 A1    Nov. 6, 2014

(30) Foreign Application Priority Data

Jan. 27, 2012   (JP) ................................ 2012-014859

(51) Int. Cl.
*H04N 5/355*    (2011.01)
*H04N 5/357*    (2011.01)
(Continued)

(52) U.S. Cl.
CPC ..... *H04N 5/3559* (2013.01); *H01L 27/14643* (2013.01); *H04N 5/3575* (2013.01); *H04N 5/37452* (2013.01); *H04N 5/363* (2013.01)

(58) Field of Classification Search
None
See application file for complete search history.

(56) References Cited

U.S. PATENT DOCUMENTS 6,115,066 A  *  9/2000  Gowda ............... H04N 5/3575
                                                    348/241
6,850,278 B1     2/2005  Sakurai et al.
(Continued)

FOREIGN PATENT DOCUMENTS

EP    1 732 134 A1    12/2006
JP    63-067976        3/1988
(Continued)

OTHER PUBLICATIONS

International Search Report; International Application No. PCT/JP2013/050407; Date of completion of the International Search: Mar. 27, 2013. (Form PCT/ISA/210).
(Continued)

*Primary Examiner* — Justin P. Misleh
(74) *Attorney, Agent, or Firm* — Michael Best & Friedrich LLP

(57) ABSTRACT

A pixel includes detection portions which detect transferred charges, a reset portion which resets the plurality of detection portions, a connection/separation control portion which controls connection and separation of the detection portions, and an output portion which outputs a signal corresponding to the potential of a detection portion. In a state where the connection/separation control portion connects the detection portions, the output portion outputs a connection-state reset level signal and a connection-state output signal and, in a state where the connection/separation control portion separates the detection portions, the output portion outputs a separation-state reset level signal and a separation-state output signal. A first pixel signal is generated by a difference between the connection-state reset level signal and the connection-state output signal, and a second pixel signal is generated by a difference between the separation-state reset level signal and the separation-state output signal.

5 Claims, 6 Drawing Sheets

(51) Int. Cl.
*H04N 5/3745* (2011.01)
*H01L 27/146* (2006.01)
*H04N 5/363* (2011.01)

(56) References Cited

U.S. PATENT DOCUMENTS

| | | | |
|---|---|---|---|
| 2004/0251394 A1 | 12/2004 | Rhodes et al. | |
| 2005/0083790 A1 | 4/2005 | Murakami et al. | |
| 2008/0237446 A1 | 10/2008 | Oshikubo et al. | |
| 2009/0040352 A1* | 2/2009 | Kawaguchi | G06F 3/044 348/308 |
| 2012/0002089 A1* | 1/2012 | Wang | H01L 27/14603 348/297 |
| 2012/0132787 A1* | 5/2012 | Mabuchi | H04N 5/363 250/208.1 |

FOREIGN PATENT DOCUMENTS

| | | |
|---|---|---|
| JP | 2000-165754 | 6/2000 |
| JP | 2005-083790 | 3/2005 |
| JP | 2006-019343 A | 1/2006 |
| JP | 2006-080937 A | 3/2006 |
| JP | 2007-516654 | 6/2007 |
| JP | 2008-205639 A | 9/2008 |
| JP | 2008-259228 A | 10/2008 |
| JP | 2009-505498 A | 2/2009 |
| WO | WO-2005/083790 A1 | 9/2005 |

OTHER PUBLICATIONS

Written Opinion of the International Searching Authority; International Application No. PCT/JP2013/050407; dated Apr. 9, 2013. (Form PCT/ISA/220 and PCT/ISA/237).
Extended European Search Report dated Aug. 20, 2015 for corresponding European Application No. 13741593.1.
Akahane N., "A Sensitivity and Linearity Improvement of a 100 dB Dynamic Range CMOS Image Sensor Using a Lateral Overflow Integration Capacitor" VLSI Circuits, 2005, Digest of Technical Papers, Symposium On, IEEE, Piscataway, NJ, Jun. 16, 2005, pp. 62-65 XP010818336.
Japanese Office Action dated Oct. 20, 2016 for corresponding Japanese Application No. 2013-555217.
Chinese Office Action dated May 31, 2017 for corresponding Chinese Application No. 201380011297.5.

* cited by examiner

SOLID-STATE IMAGING ELEMENT WITH LATCH CIRCUITS AND ELECTRONIC DEVICE EQUIPPED WITH THE SAME

TECHNICAL FIELD

The present technology relates to a solid-state imaging element, a driving method thereof, and an electronic device equipped therewith. The technology particularly relates to a solid-state imaging element in which satisfactory S/N can be achieved with respect to both a signal in a high brightness mode and a signal in a low brightness mode and reset noise can be appropriately removed, a driving method thereof, and an electronic device equipped therewith.

BACKGROUND ART

A CMOS image sensor has been known as a solid-state imaging element (an image sensor). The CMOS image sensor has been used for a digital still camera, a digital video camera, and various mobile terminal devices, such as a mobile phone with a camera.

In most cases of image sensors in the related art, a signal is extracted in such a manner that a charge of the photodiode (PD) is transferred to a floating diffusion (FD), and then potential of FD is subjected to sensing. In this case, when capacity of FD is small, gain converted into voltage increases, and thus subsequent noise is reduced. Therefore, satisfactory S/N is ensured and an amount of usable charges is small. When capacity of FD is large, the amount of usable charges is large and S/N is small.

A configuration in which FD is constituted by two capacitors to solve the trade-off between the amount of charges and S/N, and thus, when the amount of charges is small, a signal (S1) sensed by one capacitor is used and, when the amount of the charges is large, a signal (S2) sensed by two capacitors is used has been proposed (for example, see PTLs 1 to 3).

Even in a case to which the technology of this proposal is applied, an actual signal is obtained by calculating a difference between S1 or S2 and one or two reset level signals (N) in a state where FD1 or FD2 is reset, similarly to a case in which one FD is provided.

CITATION LIST

Patent Literature

PTL 1: Japanese Unexamined Patent Application Publication No. 63-67976
PTL 2: Japanese Unexamined Patent Application Publication (Translation of PCT Application) No. 2009-505498
PTL 3: International Publication No. 2005-083790

SUMMARY OF INVENTION

Technical Problem

However, in the technology of the related art, at least one of the following problems remains.

A first problem is that at least either one of S1 or S2 cannot remove reset noise or the like even when a difference is obtained.

A second problem is that it is necessary to perform an addition process to obtain a signal in a high brightness mode. In other words, when an addition process is not performed in a low brightness mode, a linearity of the signal is deteriorated before and after a start of the addition process and, when an addition process is performed in a low brightness mode, noise increases. Particularly, when a signal of S1 exceeds a range in which a linearity of an output of a pixel is ensured, this problem becomes significant.

In a case of PTL 1, for example, PD also functions as a first FD, and thus S1 and S2 are output, and then a reset level (N) is obtained by resetting PD, similarly to a so-called three-transistor-type pixel. Therefore, reset noise remains in both signals even when a difference relative to N is obtained.

Furthermore, in a case of PTL 2, PD and FD are separated by a transfer transistor, and thus the technology of PTL 2 is applied to a so-called four-transistor-type pixel. Thus, it is possible to remove reset noise by obtaining a difference between S1 and N and it is not possible to remove reset noise of S2, similarly to a four-transistor-type pixel.

In a case of PTL 3, FD is divided into two portions. However, charges are also accumulated in FD in such a manner that, when accumulation of charges is performed, the charges overflow from PD to FD. Therefore, reset noise and dark current of FD, which corresponds to an accumulation period, overlap in S2. In addition, signals are obtained in the order of N1→S1→S2→N2, and thus it is required that a column signal processing circuit be constituted by a circuit capable of handling both a reset level and a signal level, whichever comes first.

The technology is disclosed under consideration of circumstances described above. According to the technology, it is possible to achieve satisfactory S/N with respect to both a signal in a high brightness mode and a signal in a low brightness mode and, furthermore, it is possible to appropriately remove reset noise.

Solution to Problem

According to a first aspect of the technology, there is provided a solid-state imaging element that has a pixel area in which a plurality of pixels are aligned. The pixel includes a photoelectric conversion portion which performs photoelectric conversion, a transmission portion which transfers a charge from the photoelectric conversion portion, a plurality of detection portions which detect the charge transferred by the transmission portion, a reset portion which resets the plurality of detection portions, a connection/separation control portion which controls connection and separation of the plurality of the detection portions, and an output portion which outputs a signal corresponding to potential of the detection portion. In a state where the connection/separation control portion connects the plurality of detection portions, the output portion outputs a connection-state reset level signal and a connection-state output signal and, in a state where the connection/separation control portion separates the plurality of detection portions, the output portion outputs a separation-state reset level signal and a separation-state output signal. A first pixel signal is generated by a difference between the connection-state reset level signal and the connection-state output signal and a second pixel signal is generated by a difference between the separation-state reset level signal and the separation-state output signal.

It is preferable that either one of the first pixel signal or the second pixel signal be selected based on a level of the first pixel signal, and the selected first pixel signal or the selected second pixel signal be output as a pixel signal related to the pixel.

It is preferable that the pixels be aligned in a two-dimensional matrix shape, and a difference of signals which are output from the output portion be calculated by a difference calculation portion which is arranged to correspond to each row of the pixels.

It is preferable that the pixels be aligned in a two-dimensional matrix shape, and a difference of signals which are output from the output portion be calculated by a difference calculation portion which is arranged to correspond to each row of the pixels and is constituted by a Correlated Double Sampling (CDS) circuit having a sample holder.

It is preferable that the pixels be aligned in a two-dimensional matrix shape, and a difference of signals which are output from the output portion be calculated by a difference calculation portion which is arranged to correspond to each row of the pixels and has a latch circuit that holds the connection-state reset level signal, the separation-state reset level signal, the separation-state output signal, and the connection-state output signal.

It is preferable that the pixels be aligned in a two-dimensional matrix shape, and a difference of signals which are output from the output portion be calculated by a difference calculation portion which is arranged to correspond to each row of the pixels and has a first up/down counter that counts a level of the connection-state reset level signal in one direction and counts a level of the connection-state output signal in the other direction and a second up/down counter that counts a level of the separation-state reset level signal in one direction and counts a level of the separation-state output signal in the other direction.

According to a first aspect of the technology there is provided a driving method of a solid-state imaging element that has a pixel area in which a plurality of pixels are aligned, in which the pixel includes a photoelectric conversion portion which performs photoelectric conversion, a transmission portion which transfers a charge from the photoelectric conversion portion, a plurality of detection portions which detect the charge transferred by the transmission portion, a reset portion which resets the plurality of detection portions, a connection/separation control portion which controls connection and separation of the plurality of the detection portions, and an output portion which outputs a signal corresponding to potential of the detection portion, in which, in a state where the connection/separation control portion connects the plurality of detection portions, the output portion outputs a connection-state reset level signal and a connection-state output signal and, in a state where the connection/separation control portion separates the plurality of detection portions, the output portion outputs a separation-state reset level signal and a separation-state output signal, and a first pixel signal is generated by a difference between the connection-state reset level signal and the connection-state output signal and a second pixel signal is generated by a difference between the separation-state reset level signal and the separation-state output signal.

In the first aspect of the technology, in the reset signal output operation, in a connected state in which the plurality of detection portions are connected to each other, a connection-state reset level signal is output by resetting the detection portion and thus, in a separated state in which the plurality of detection portions are separated from each other, a separation-state reset level signal is output in the same manner. Furthermore, in the output signal output operation, when in the separated state, a separation-state output signal is output and, when in the connected state, a connection-state output signal is output. In addition, a first pixel signal is generated by calculating a difference between the connection-state reset level signal and the connection-state output signal. A second pixel signal is generated by calculating a difference between the separation-state reset level signal and the separation-state output signal.

According to a second aspect of the technology, there is provided an electronic device that has a solid-state imaging element which has a pixel area in which a plurality of pixels are aligned, in which the pixel includes a photoelectric conversion portion which performs photoelectric conversion, a transmission portion which transfers a charge from the photoelectric conversion portion, a plurality of detection portions which detect the charge transferred by the transmission portion, a reset portion which resets the plurality of detection portions, a connection/separation control portion which controls connection and separation of the plurality of the detection portions, and an output portion which outputs a signal corresponding to potential of the detection portion, in which, in a state where the connection/separation control portion connects the plurality of detection portions, the output portion outputs a connection-state reset level signal and a connection-state output signal and, in a state where the connection/separation control portion separates the plurality of detection portions, the output portion outputs a separation-state reset level signal and a separation-state output signal, and a first pixel signal is generated by a difference between the connection-state reset level signal and the connection-state output signal and a second pixel signal is generated by a difference between the separation-state reset level signal and the separation-state output signal.

In the second aspect of the technology, in the reset signal output operation, in a connected state in which the plurality of detection portions are connected to each other, a connection-state reset level signal is output by resetting the detection portion and thus, in a separated state in which the plurality of detection portions are separated from each other, a separation-state reset level signal is output in the same manner. Furthermore, in the output signal output operation, when in the separated state, a separation-state output signal is output and, when in the connected state, a connection-state output signal is output. In addition, a first pixel signal is generated by calculating a difference between the connection-state reset level signal and the connection-state output signal. A second pixel signal is generated by calculating a difference between the separation-state reset level signal and the separation-state output signal.

Advantageous Effects of Invention

According to the technology, it is possible to achieve satisfactory S/N with respect to both a signal in a high brightness mode and a signal in a low brightness mode and, furthermore, it is possible to appropriately remove reset noise.

DESCRIPTION OF EMBODIMENTS

Hereinafter, embodiments of the technology disclosed in this specification will be described with reference to the accompanying drawings.

Figure 1:
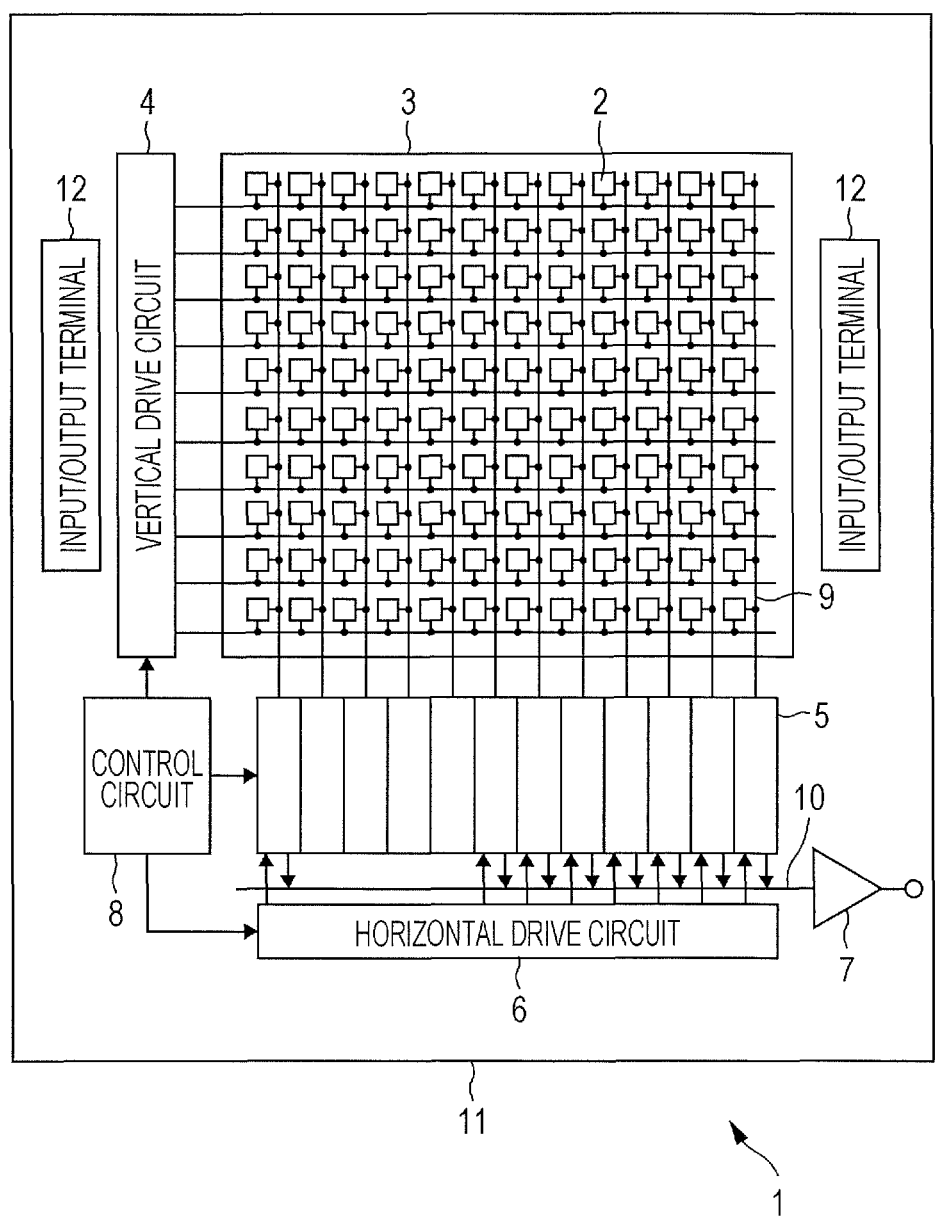
FIG. 1 is a view illustrating a configurational example of an embodiment of a CMOS image sensor according to the technology.

FIG. 1 is a block diagram which illustrates a configurational example of a CMOS image sensor according to an embodiment of the technology.

A CMOS image sensor 1 illustrated in FIG. 1 is constituted by a semiconductor substrate 11 (for example, a silicon substrate) that has a pixel area 3 in which a plurality of pixels 2 including photoelectric conversion portions are aligned in a two-dimensional matrix shape and peripheral circuit portions.

The pixel 2 is a unit pixel which is constituted by one photoelectric conversion portion, a plurality of floating diffusion portions, and a plurality of pixel transistors. In addition, the pixel 2 can have a so-called pixel sharing structure in which a plurality of floating diffusion portions and a plurality of photoelectric conversion portions share pixel transistors except transfer transistors.

The detail of a configuration of the pixel 2 will be described below.

A plurality of pixel transistors described above can have a configuration in which, for example, a separation transistor is further provided in addition to four transistors, that is, a transfer transistor, a reset transistor, an amplification transistor, and a select transistor. Alternatively, the plurality of pixel transistors can have a configuration in which a separation transistor is further provided in addition to three transistors except for a select transistor.

The peripheral circuit portions are constituted by so-called analog circuits and logic circuits, such as a vertical drive circuit 4, a column signal processing circuit 5, a horizontal drive circuit 6, an output circuit 7, and a control circuit 8.

The control circuit 8 receives an input clock and data which command operation modes and the like and outputs data, such as internal information of the CMOS image sensor 1. Furthermore, the control circuit 8 generates, on the basis of a vertical synchronization signal, a horizontal synchronization signal, and a master clock, a clock signal and a control signal which function as references of operations of the vertical drive circuit 4, the column signal processing circuit 5, the horizontal drive circuit 6, and the like. Then, the control circuit 8 inputs the signals to the vertical drive circuit 4, the column signal processing circuit 5, the horizontal drive circuit 6, and the like.

The vertical drive circuit 4 is constituted by, for example, a shift register. The vertical drive circuit 4 drives the pixels row by row in such a manner that the vertical drive circuit 4 selects pixel driving wiring and applies, to the selected pixel driving wiring, a pulse for driving the pixels. In other words, the vertical drive circuit 4 selects and scans, in a vertical direction, the respective pixels 2 in the pixel area 3, row by row and in order. The vertical drive circuit 4 supplies a pixel signal, based on a signal charge which is generated in a photoelectric conversion element (for example, a photodiode) of each pixel 2 in accordance with an amount of light received, to the column signal processing circuit 5 through a vertical signal line 9.

Although, a specific configuration of the vertical drive circuit 4 is not illustrated in the accompanying drawing, the vertical drive circuit 4 has a configuration in which a readout scanning system and a sweep scanning system are provided. Alternatively, the vertical drive circuit 4 has a configuration in which a batch sweep and a batch transfer are performed.

To read a signal from the unit pixel, the readout scanning system selects and scans the unit pixels in the pixel area 3, row by row and in order. In the case of row driving (a rolling shutter operation), when a sweep operation is performed, a sweep scanning operation is performed on a read row which is subjected to readout scanning by the readout scanning system, prior to the readout scanning operation by the time of a shutter speed. Furthermore, in a case of global exposure (a global shutter operation), a batch sweep operation is performed prior to a batch transfer operation by the time of a shutter speed.

The sweeping operation described above is performed, and thus an unnecessary charge is swept (reset) from the photoelectric conversion element of a unit pixel in the read row. A so-called electronic shutter operation is performed in such a manner that an unnecessary charge is swept (reset). In this case, the electronic shutter operation means an operation in which photoelectric charges in the photoelectric conversion element is removed and exposure is started anew (accumulation of the photoelectric charge is started).

The signal which is read by the readout operation of the readout scanning system corresponding to an amount of light which is received immediately before the readout operation or received after the electronic shutter operation. In a case of row driving, a period from the readout time by the preceding readout operation or the sweeping time by the electronic shutter operation to the readout time by the current readout operation is set to an accumulation period (an exposure period) of the photoelectric charge in the unit pixel. In a case of the global exposure, a period from a batch sweep to a batch transfer is set to the accumulation period (the exposure period).

The column signal processing circuit 5 is provided for, for example, each row of the pixels 2. The column signal processing circuit 5 receives the pixel signal which is output from the pixels 2 forming one row and obtains a difference between a signal level and a reset level of each pixel row. Then, the column signal processing circuit 5 performs a signal process, such as noise removal. In other words, the column signal processing circuit 5 performs signal processes such as Correlated Double Sampling (CDS) for removing fixed pattern noise of the pixel 2, a signal amplification, an Analog-to-Digital conversion (AD conversion), and the like. A horizontal selection switch (not illustrated) is provided to be connected between an output terminal of the column signal processing circuit 5 and a horizontal signal line 10.

The horizontal drive circuit 6 is constituted by, for example, a shift register. The horizontal drive circuit 6 outputs horizontal scanning pulses in order, and thus the horizontal drive circuit 6 selects the respective column signal processing circuits 5 in order and causes the selected column signal processing circuit 5 to output the pixel signal to the horizontal signal line 10.

The output circuit 7 performs signal processes, such as a gain adjustment and a defect correction, on image signals which are supplied from the respective column signal processing circuits 5 through the horizontal signal line 10 in order, and then outputs the image signals. In some cases, only buffering is performed in the signal process. However, in some other cases, a black level adjustment, a column variation correction, various digital signal processes or the like is performed.

An input/output terminal 12 sends/receives signals to/from an external portion.

Next, the detail of a configuration of the pixel 2 will be described. In this case, a configuration of the pixel 2 as one unit pixel of a plurality of unit pixels in the pixel area 3 will be described.

Each pixel 2 illustrated in FIG. 1 is an accumulation portion which detects physical quantities and accumulates the charge in accordance with the physical quantities. The pixel 2 has a configuration in which a photodiode PD as a photoelectric conversion portion and a transfer transistor which transfers the charge from the photodiode PD are provided.

In addition, the pixels 2 are a plurality of detection portions which receive the charges from the photodiodes PD through the transfer transistors. The pixel 2 has a configuration in which a plurality of floating diffusion portions FD and a reset transistor which resets the floating diffusion portions FD are provided.

Furthermore, the pixel 2 has a configuration in which a separation transistor controls connection and separation of the plurality of floating diffusion portions FD in an on/off manner and an amplification transistor outputs a signal corresponding to potential of the floating diffusion portion FD.

Figure 2:
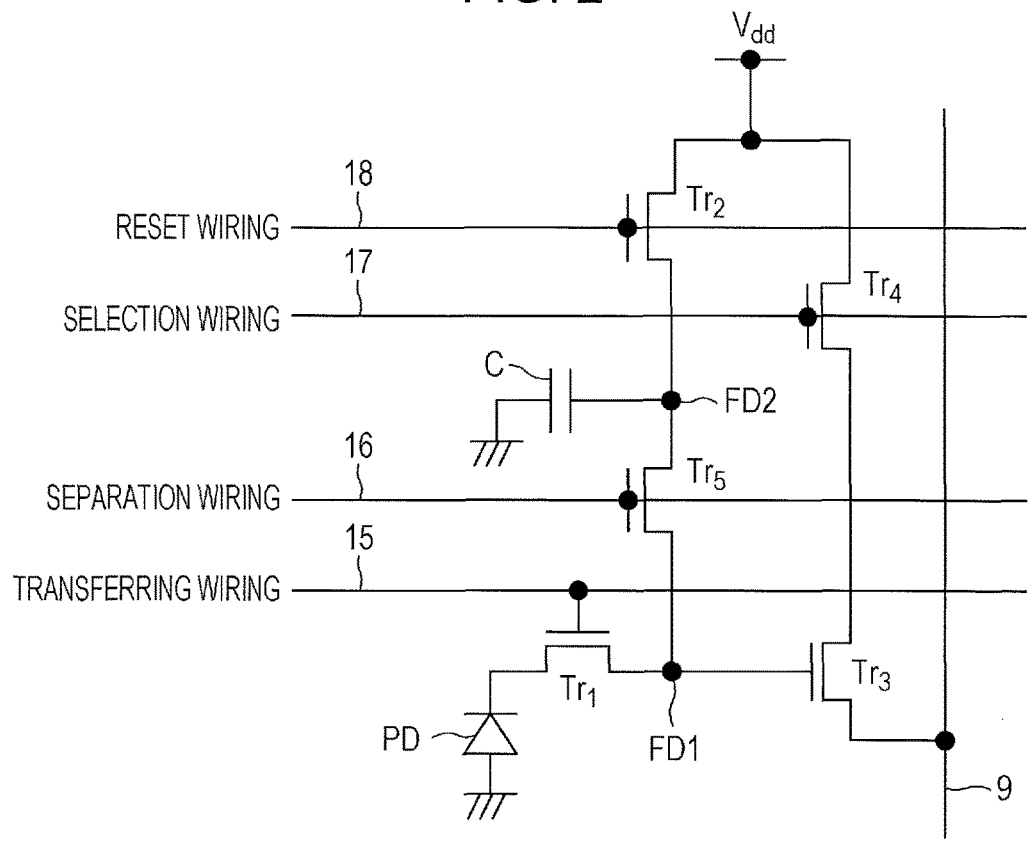
FIG. 2 is a view illustrating a configurational example of a unit pixel.

FIG. 2 illustrates an example of an equivalent circuit of the pixel 2. In this example, (an equivalent circuit of) the pixel 2 has a configuration in which two floating diffusion portions are provided.

The pixel 2 has one photodiode PD, as illustrated in FIG. 2. In addition, the pixel 2 has one transfer transistor Tr1, one reset transistor Tr2, one amplification transistor Tr3, one select transistor Tr4, and one separation transistor Tr5. Furthermore, the pixel 2 has two floating diffusion portions FD1 and FD2.

In a configuration in FIG. 2, the photodiode PD is connected to a first floating diffusion portion FD1 via the transfer transistor Tr1. The first floating diffusion portion FD1 is connected to a gate of the amplification transistor Tr3 and connected to a second floating diffusion portion FD2 via the separation transistor Tr5. The second floating diffusion portion FD2 is connected to the reset transistor Tr2 and connected to a capacitance element (capacitor) C. The other end of the capacitor C is grounded.

In this example, the total capacitance of the second floating diffusion portion FD2 is increased in such a manner that the second floating diffusion portion FD2 is configured not only to use parasitic capacitance but also to be connected to the capacitor C. The capacitor C can be formed of, for example, polysilicon. Alternatively, the second floating diffusion portion FD2 may use only parasitic capacitance of a diffusion layer without using the capacitor C. As an example, the capacitor C may have a structure of polysilicon film-gate oxide film-Si substrate or may have a structure of first polysilicon film-interlayer film, such as SiN, -second polysilicon film.

A drain of the amplification transistor Tr3 is connected to the select transistor Tr4 and a source of the amplification transistor Tr3 is connected to the vertical signal line 9. In addition, drains of the reset transistor Tr2 and the select transistor Tr4 are connected to a power source Vdd.

To suitably perform the signal readout operation in both a low brightness mode and a high brightness mode, it is preferable that, for example, the second floating diffusion portion FD2 have a capacity of approximately 2 times to 20 times what the first floating diffusion portion FD1 has. In addition, it is preferable that the capacity of the second floating diffusion portion FD2 be set to the amount suitable for receiving a saturation charge of the photodiode PD. When the capacity of the second floating diffusion portion FD2 is significantly small, a difference in gains between a signal S1 and a signal S2 described below is small, and thus effect by the second floating diffusion portion FD2 is small. In contrast, when the capacity of the second floating diffusion portion FD2 is significantly large, almost the entirety of a signal area is handled by the signal S2, and thus the signal S1 is almost useless.

A gate of the transfer transistor Tr1 is connected to transferring wiring 15. A gate of the separation transistor Tr5 is connected to separation wiring 16. A gate of the select transistor Tr4 is connected to selection wiring 17. A gate of the reset transistor Tr2 is connected to reset wiring 18.

In the pixel 2, when the select transistor Tr4 is turned on, the amplification transistor Tr3 outputs, to the vertical signal line 9, a signal which corresponds to the potential of the first floating diffusion portion FD1. Furthermore, when the separation transistor Tr5 is turned on, the amplification transistor Tr3 outputs, to the vertical signal line 9, a signal which corresponds to the potential of the first and second floating diffusion portions FD1 and FD2 in a connected state. The vertical signal line 9 is connected to a column signal processing circuit which is a post-stage circuit, and thus the signal output to the vertical signal line 9 is sent to the column signal processing circuit.

The reset transistor Tr2 resets the first floating diffusion portion FD1 and the second floating diffusion portion FD2 in such a manner that the reset transistor Tr2 causes the charges of the first floating diffusion portion FD1 and the second floating diffusion portion FD2 to be drained to the power source Vdd (that is, power source wiring).

Next, a driving method of the circuit illustrated in FIG. 2 will be described with reference to FIGS. 3 and 4.

Figure 3:
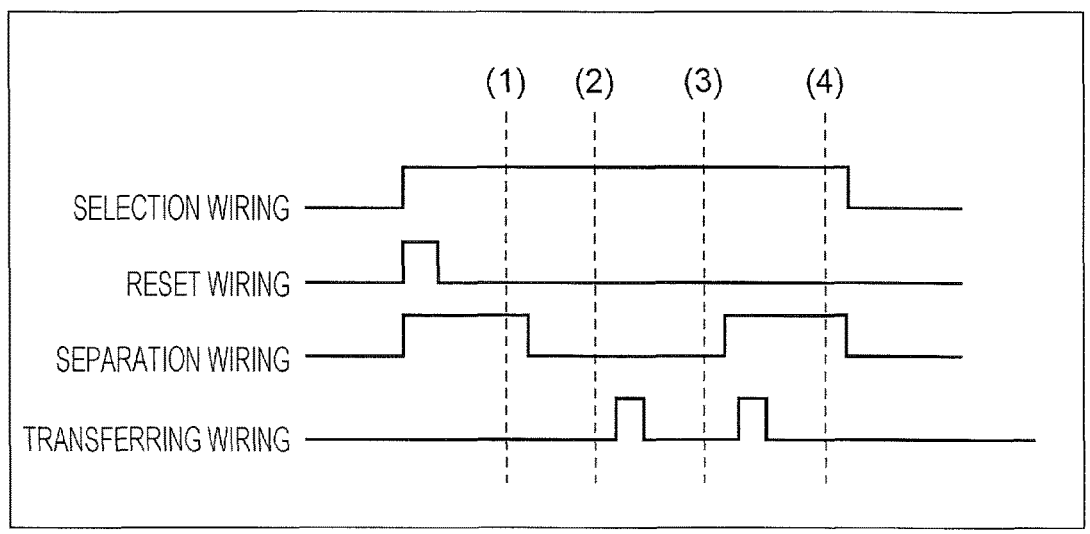
FIG. 3 is a timing chart for explaining an operation example of the unit pixel.

FIG. 3 is a timing chart of control signals which are generated by the control circuit 8 and supplied to the pixel 2 through the vertical drive circuit 4. In FIG. 3, a horizontal axis indicates time and a vertical axis indicates a voltage value. FIG. 3 illustrates control signals constituting pulses which are applied to the selection wiring 17, the reset wiring 18, the separation wiring 16, and the transferring wiring 15 illustrated in FIG. 2.

Figure 4:
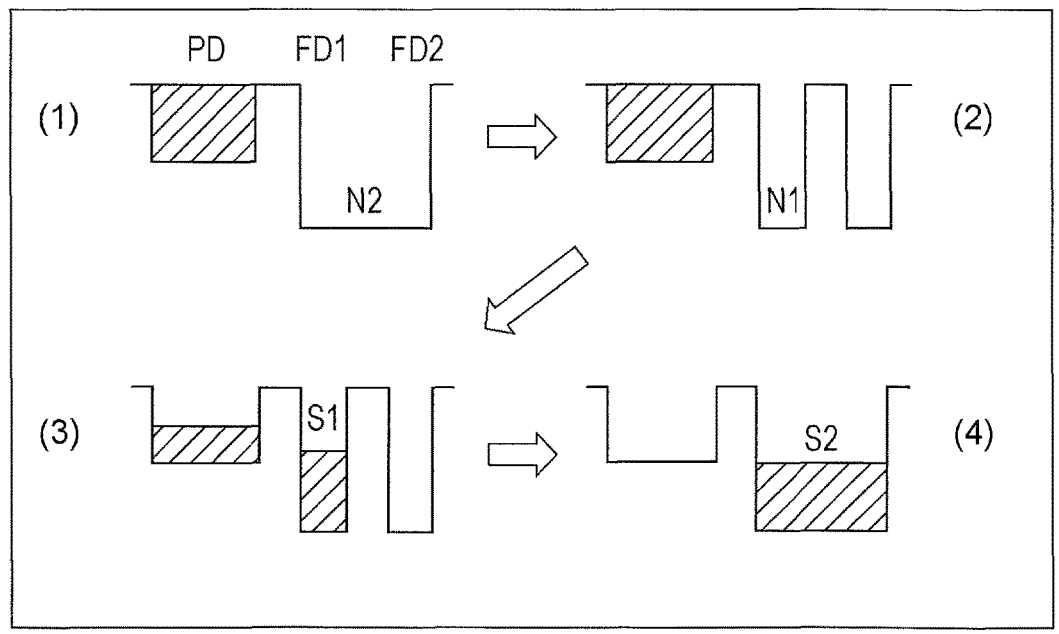
FIG. 4 is a potential map for explaining an operation example of the unit pixel.

FIG. 4 is a potential map which schematically illustrates states of charges which are accumulated in the photodiode PD (hereinafter, appropriately referred to simply as PD), the first floating diffusion portion FD1 (hereinafter, appropriately referred to simply as FD1), and the second floating diffusion portion FD2 (hereinafter, appropriately referred to simply as FD2) of FIG. 2. In FIG. 4, states of the charges in PD, FD1, and FD2 at Time (1) to (4) which are shown by the vertical dotted line in FIG. 3 are illustrated.

As illustrated in FIG. 3, the pulse is applied to the select transistor Tr4 through the selection wiring 17 so as to turn on the select transistor Tr4, and thus the pixel is selected. In this state, the pulse is applied to the reset transistor Tr2 and the separation transistor Tr5 through the reset wiring 18 and the separation wiring 16 so as to turn on the reset transistor Tr2 and the separation transistor Tr5, and thus FD1 and FD2 are reset. Then, the pulse of the reset wiring 18 is lowered, and thus the reset transistor Tr2 is turned off (Time (1)).

At this time, the states of the charges accumulated in PD, FD1, and FD2 are as shown in (1) of FIG. 4. In other words, the separation transistor Tr5 is turned on, and thus FD1 and FD2 are connected. In addition, the charge corresponding to the amount of received light is accumulated in the photodiode PD. In this state, a reset level signal which is output to the vertical signal line 9 via the amplification transistor Tr3 is sent, as N2, to the column signal processing circuit 5.

Next, the pulse of the separation wiring 16 is lowered, as illustrated in FIG. 3, and thus the separation transistor Tr5 is turned off (Time (2)).

At this time, states of the charges accumulated in PD, FD1, and FD2 are as shown in (2) of FIG. 4. In other words, the separation transistor Tr5 is turned off, and thus FD1 and FD2 are separated from each other. In addition, the charge corresponding to the amount of received light is accumulated in the photodiode PD. In this state, the reset level signal which is output to the vertical signal line 9 via the amplification transistor Tr3 is sent, as N1, to the column signal processing circuit 5.

Subsequently, the pulse of the transferring wiring 15 is applied to the transfer transistor Tr1 so as to turn on the transfer transistor Tr1, as illustrated in FIG. 3, and then the transfer transistor Tr1 is turned off (Time (3)). Therefore, the charge is transferred from PD to FD1. However, in this case, when an amount of the charge accumulated in PD is large, the charge also remains in PD.

At this time, states of the charges accumulated in PD, FD1, and FD2 are as shown in (3) of FIG. 4. In other words, the transfer transistor Tr1 is turned on, and thus the charge is transferred from PD to FD1. In this example, the amount of the charge accumulated in PD is large, and thus the charge also remains in PD. In this state, an output signal from FD1, which is output to the vertical signal line 9 via the amplification transistor Tr3, is sent, as S1, to the column signal processing circuit 5.

Subsequently, as illustrated in FIG. 3, the pulse is applied to the separation wiring 16 so as to turn on the separation transistor Tr5 and the pulse is applied to the transferring wiring 15 so as to turn on the transfer transistor Tr1, and then the transfer transistor Tr1 is turned off (Time (4)).

At this time, states of the charges accumulated in PD, FD1, and FD2 are as shown in (4) of FIG. 4. In other words, the separation transistor Tr5 is turned on, and thus FD1 and FD2 are connected to each other. In addition, the transfer transistor Tr1 is turned on, and thus the charges are transferred to PD, FD1 and FD2. In this case, the charges remaining in PD, which are stored at Time (3) in FIG. 4, are also transferred to FD1 and FD2. In this state, an output signals from FD1 and FD2, which are output to the vertical signal line 9 via the amplification transistor Tr3, are sent, as S2, to the column signal processing circuit 5.

In a case of the output signal S1 described above, it is considered that a signal caused by the charge is superimposed on the reset level signal N1, and thus the output signal S1 is detected. Therefore, a difference between the output signal S1 and the reset level signal N1 is obtained in the column signal processing circuit 5, and thus it is possible to obtain the pixel signal of which reset noise or the like is removed. This signal is a signal with a high gain. However, when, for example, the amount of the charge accumulated in PD is large, it is possible to obtain an accurate signal. Therefore, this signal is a pixel signal suitable for the low brightness mode. Also, this signal is referred to as a first pixel signal.

Furthermore, in a case of the output signal S2 described above, it is considered that a signal caused by the charge is superimposed on the reset level signal N2, and thus the output signal S2 is detected. Therefore, a difference between the output signal S2 and the reset level signal N2 is obtained in the column signal processing circuit 5, and thus it is possible to obtain the pixel signal of which reset noise or the like is removed. This signal is accurate regardless of whether the amount of the charge accumulated in PD is large or small. However, this signal is a signal with a low gain. Therefore, this signal is a pixel signal suitable for the high brightness mode and is referred to as a second pixel signal.

In the technology, the reset level signals N1 and N2 are obtained as described above. The reset level signal N2 is obtained in a state where a reset operation is performed and FD1 and FD2 are connected. The reset level signal N1 is obtained in a state where a reset operation is performed and FD1 and FD2 are separated. In addition, the output signal S1 in a state where FD1 and FD2 are separated and the output signal S1 in a state where FD1 and FD2 are separated are obtained. Then, the first pixel signal of which the reset noise is removed is extracted by obtaining the difference between the output signal S1 and the reset level signal N1 and the second pixel signal of which the reset noise is removed is extracted by obtaining the difference between the output signal S2 and the reset level signal N2.

It is not possible to accurately remove the reset noise, even when, for example, a process, such as transferring of the charge of PD, is performed in a state where the reset operation is performed, and then a reset level signal in a state where FD1 and FD2 are connected is obtained. In contrast, according to the technology, it is possible to accurately remove the reset noise in both cases of when the first pixel signal is extracted and when the second pixel signal is extracted.

Furthermore, according to the technology, it is not necessary to perform an addition of a signal in both cases of when the first pixel signal is extracted and when the second pixel signal is extracted.

In a case where, for example, an addition of a signal is performed, when the addition of a signal is not performed in the low brightness mode, a linearity of a signal is deteriorated before and after the start of the addition. Therefore, when the addition is also performed in the low brightness mode, this results in an increase in noise. In contrast, according to the technology, it is possible to extract the first pixel signal and the second pixel signal, without deteriorating the linearity of the signal and causing an increase in noise.

Next, the detail of a method for obtaining a pixel signal of which the reset noise or the like is removed will be described. As described above, the reset level signal N1, the reset level signal N2, the output signal S1, and the output signal S2 are sent to the column signal processing circuit 5.

The column signal processing circuit 5 has a configuration in which an ADC for performing AD conversion, a CDS for removing reset noise, and the like are provided. In other words, a pixel signal extraction portion having an ADC, a CDS, and the like is provided in the column signal processing circuit 5 of FIG. 1, so as to correspond to each vertical signal line 9.

Figure 5:
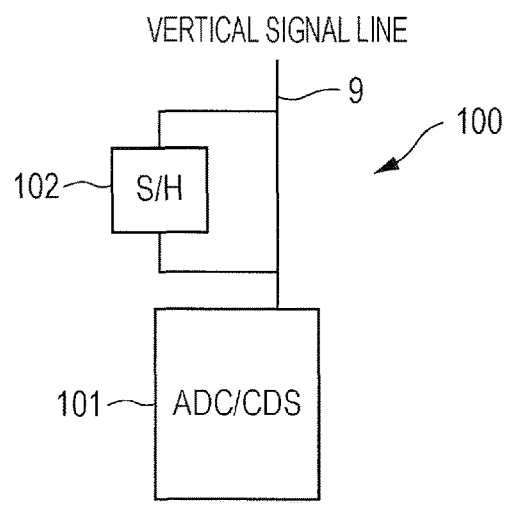
FIG. 5 is a block diagram illustrating a configurational example of a pixel signal extraction portion.

FIG. 5 is a block diagram illustrating a configurational example of a pixel signal extraction portion 100 which is provided in the column signal processing circuit 5. In an example of FIG. 5, an ADC/CDS portion 101 and a sample holder (SH) portion 102 are connected to the vertical signal line 9.

In the pixel signal extraction portion 100 of FIG. 5, when the time is at Time (1) of FIG. 3, that is, in a state of (1) of FIG. 4, the reset level signal N2 is held in the sample holder portion 102.

The ADC/CDS portion 101 obtains a difference between the reset level signal N1 which is obtained at Time (2) of FIG. 3, that is, in a state of (2) of FIG. 4 and the output signal S1 which is obtained at Time (3) of FIG. 3, that is, in a state of (3) of FIG. 4, and performs the AD conversion, and thus a first pixel signal is extracted.

Furthermore, the ADC/CDS portion 101 obtains a difference between the reset level signal N2 which is held in the sample holder portion 102 and the output signal S2 which is obtained at Time (4) of FIG. 3, that is, in a state of (4) of FIG. 4, and performs the AD conversion, and thus the second pixel signal is extracted.

Next, in the column signal processing circuit 5, either one of the first pixel signal or the second pixel signal is selected by a selection portion (not illustrated) which is provided in a subsequent-stage of the pixel signal extraction portion 100, and then the selected signal is output. In the column signal processing circuit 5, when a value of the first pixel signal is lower than a predetermined threshold value, for example, the first pixel signal is selected and output. In addition, when the value of the first pixel signal is not lower than the predetermined threshold value, the second pixel signal is selected and output.

Figure 6:
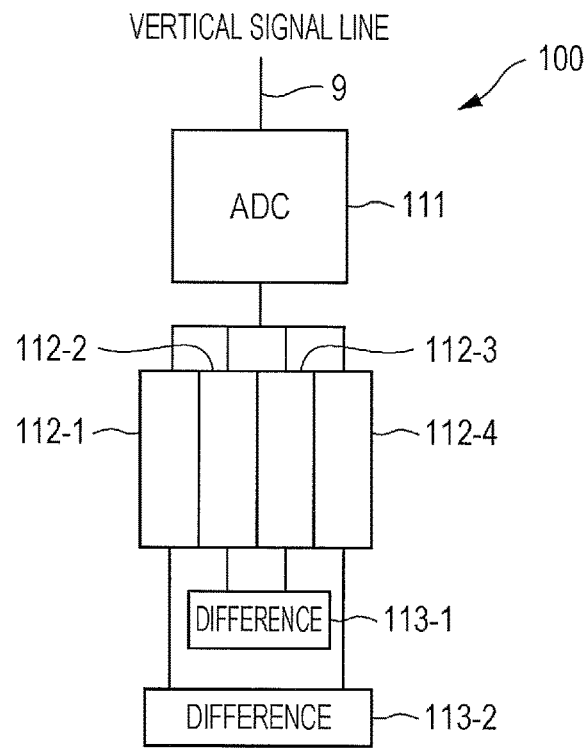
FIG. 6 is a block diagram illustrating a configurational example of the pixel signal extraction portion.

FIG. 6 is a block diagram illustrating a configurational example of the pixel signal extraction portion 100 which is provided in the column signal processing circuit 5. In an example of FIG. 6, an ADC portion 111 is connected to the vertical signal line 9 and latch circuits 112-1 to 112-4 are connected to the ADC portion 111. Furthermore, difference calculation portions 113-1 to 113-2 are connected to the latch circuits 112-1 to 112-4.

In the pixel signal extraction portion 100 of FIG. 6, when the time is at Time (1) of FIG. 3, that is, in a state of (1) of FIG. 4, the reset level signal N2 is subjected to the AD conversion by the ADC portion 111, and then the AD converted signal is held in the latch circuit 112-1. When the time is at Time (2) of FIG. 3, that is, in a state of (2) of FIG. 4, the reset level signal N1 is subjected to the AD conversion by the ADC portion 111, and then the AD converted signal is held in the latch circuit 112-2. Furthermore, when the time is at Time (3) of FIG. 3, that is, in a state of (3) of FIG. 4, the output signal S1 is subjected to the AD conversion by the ADC portion 111, and then the AD converted signal is held in the latch circuit 112-3. In addition, when the time is at Time (4) of FIG. 3, that is, in a state of (4) of FIG. 4, the output signal S2 is subjected to the AD conversion by the ADC portion 111, and then the AD converted signal is held in the latch circuit 112-4.

The difference calculation portion 113-1 calculates a difference between the reset level signal N1 held in the latch circuit 112-2 and the output signal S1 held in the latch circuit 112-3, and then extracts the first pixel signal. The difference calculation portion 113-2 calculates a difference between the reset level signal N2 held in the latch circuit 112-1 and the output signal S2 held in the latch circuit 112-4, and then extracts the second pixel signal.

Figure 7:
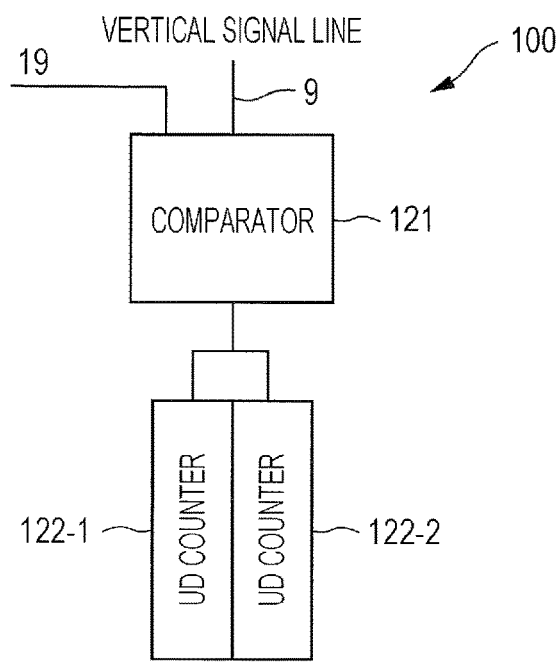
FIG. 7 is a block diagram illustrating a configurational example of the pixel signal extraction portion.

FIG. 7 is a block diagram illustrating a configurational example of the pixel signal extraction portion 100 which is provided in the column signal processing circuit 5. In an example of FIG. 7, a comparator 121 is connected to the vertical signal line 9 and a ramp signal line 19. In addition, a UD (Up-Down) counter 122-1 and a UD counter 122-2 are connected to the comparator 121.

A ramp signal is an analog signal of which the voltage increases with the elapse of time from a starting point of the signal. The comparator 121 compares the voltage of the vertical signal line 9 to the voltage of the ramp signal line 19, and then the comparator 121 sends the comparison result to the UD counters 122-1 and 122-2. The UD counters 122-1 and 122-2 perform down-counting and up-counting, on the basis of, for example, a clock which is supplied from a PLL circuit (not illustrated) or the like. More specifically, while the voltage of the vertical signal line 9 is higher than the voltage of the ramp signal line 19, the UD counters 122-1 and 122-2 perform up-counting of the clock or down-counting of the clock. Then, when a magnitude relationship between a level of the vertical signal line 9 and the voltage level of the ramp signal is inverted, a count value of the clock is held.

In the pixel signal extraction portion 100 of FIG. 7, when the time is at Time (1) of FIG. 3, that is, in a state of (1) of FIG. 4, the UD counter 122-1 performs up-counting of the clock while the level of the reset level signal N2 is higher than the level of the ramp signal. Then, when a magnitude relationship between the level of the reset level signal N2 and the level of the ramp signal is inverted, a count value of the clock is held.

In addition, when the time is at Time (2) of FIG. 3, that is, in a state of (2) of FIG. 4, the UD counter 122-2 performs up-counting of the clock while the level of the reset level signal N2 is higher than the level of the ramp signal. Then, when a magnitude relationship between the level of the reset level signal N1 and the level of the ramp signal is inverted, a count value of the clock is held.

Furthermore, when the time is at Time (3) of FIG. 3, that is, in a state of (3) of FIG. 4, the UD counter 122-2 performs down-counting of the clock while the level of the output signal S1 is higher than the level of the ramp signal. Then, when a magnitude relationship between the level of the output signal S1 and the level of the ramp signal is inverted, a count value of the clock is held. As a result, the held count value is set to a value corresponding to the difference between the output signal S1 and the reset level signal N1.

Therefore, the first pixel signal is extracted by the UD counter 122-2.

In addition, when the time is at Time (4) of FIG. 3, that is, in a state of (4) of FIG. 4, the UD counter 122-1 performs down-counting of the clock while the level of the output signal S2 is higher than the level of the ramp signal. Then, when a magnitude relationship between the level of the output signal S2 and the level of the ramp signal is inverted, a count value of the clock is held. As a result, the held count value is set to a value corresponding to the difference between the output signal S2 and the reset level signal N2.

Therefore, the second pixel signal is extracted by the UD counter 122-1.

The pixel signal extraction portion 100 described above is provided, and thus it is possible to remove the reset noise in such a manner that the output signal S1, the output signal S2, the reset level signal N1, and the reset level signal N2 illustrated in FIG. 4 are obtained using the control signals which are described with reference to FIG. 3.

In other words, according to the technology, it is possible to extract the first pixel signal and the second pixel signal from each pixel in such a manner that the pixel 2 is driven by the control signals illustrated in FIG. 3. In this case, according to the technology, the reset level signal N2 and the reset level signal N1 are obtained prior to the transferring of the charges from PD to FD1 and FD2, as illustrated in (1) and (2) of FIG. 4. Thus, it is possible to obtain the accurate reset level signal.

Figure 8:
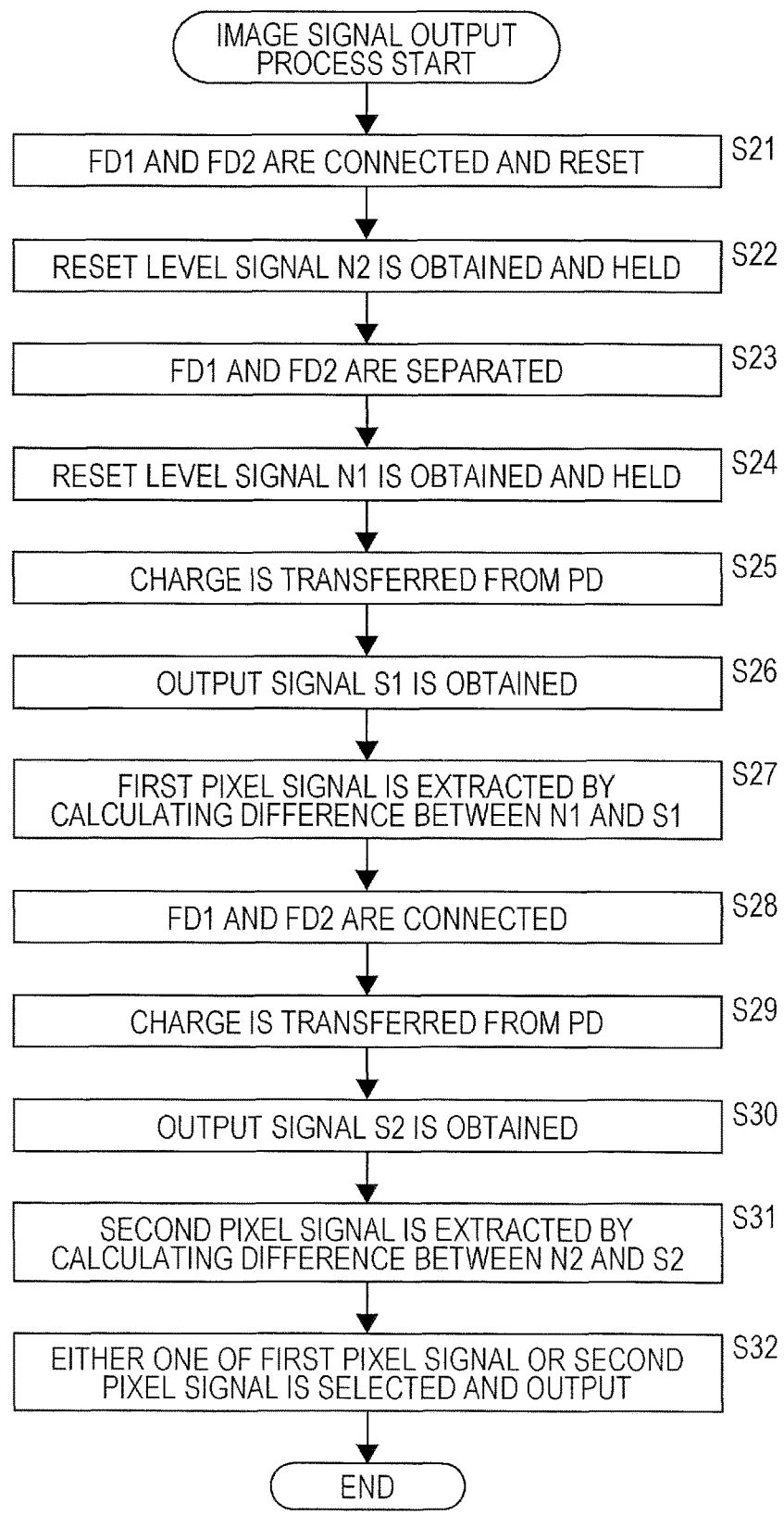
FIG. 8 is a flowchart for explaining an example of a pixel signal output process.

Next, an example of a pixel signal output process by the CMOS image sensor 1 of FIG. 1 will be described with reference to a flow chart of FIG. 8. This process is performed on the respective pixels 2 which are selected in such a manner that the pulse is applied to the select transistor Tr4 through the selection wiring 17 so as to turn on the select transistor Tr4.

In Step S21, FD1 and FD2 are connected and reset. At this time, the pulse is applied to the reset transistor Tr2 and the separation transistor Tr5 through the reset wiring 18 and the separation wiring 16 so as to turn on the reset transistor Tr2 and the separation transistor Tr5, and thus FD1 and FD2 are reset in a connected state. Then, the reset transistor Tr2 is turned off.

In Step S22, the reset level signal N2 is obtained and held.

At this time, states of the charges accumulated in PD, FD1, and FD2 are as shown in (1) of FIG. 4. In other words, the separation transistor Tr5 is turned on, and thus FD1 and FD2 are connected to each other. In addition, the charge corresponding to the amount of received light is accumulated in the photodiode PD. In this state, a reset level signal which is output to the vertical signal line 9 via the amplification transistor Tr3 is sent, as N2, to the column signal processing circuit 5. Then, the reset level signal N2 is held in the pixel signal extraction portion 100 which is described with reference to FIGS. 5 to 7.

In Step S23, FD1 and FD2 are separated from each other. At this time, the pulse of the separation wiring 16 is lowered, and thus the separation transistor Tr5 is turned off. Therefore, FD1 and FD2 are separated from each other.

In Step S24, the reset level signal N1 is obtained and held.

At this time, the states of the charges accumulated in PD, FD1, and FD2 are as shown in (2) of FIG. 4. In other words, the separation transistor Tr5 is turned off, and thus FD1 and FD2 are separated. In addition, the charge corresponding to the amount of received light is accumulated in the photodiode PD. In this state, the reset level signal which is output to the vertical signal line 9 via the amplification transistor Tr3 is sent, as N1, to the column signal processing circuit 5. Then, the reset level signal N1 is held in the pixel signal extraction portion 100.

In step S25, the charge is transferred from PD. At this time, the pulse of the transferring wiring 15 is applied to the transfer transistor Tr1, and thus the transfer transistor Tr1 is turned on, and then is turned off. Therefore, the charge is transferred from PD to FD1. However, in this case, when an amount of the charge accumulated in PD is large, the charge also remains in PD.

In Step S26, the output signal S1 is obtained.

At this time, the states of the charges accumulated in PD, FD1, and FD2 are as shown in (3) of FIG. 4. In other words, the transfer transistor Tr1 is turned on, and thus the charge is transferred from PD to FD1. In this example, the amount of the charge accumulated in PD is large, and thus the charge also remains in PD. In this state, the output signal from FD1, which is output to the vertical signal line 9 via the amplification transistor Tr3, is sent, as S1, to the column signal processing circuit 5.

In Step S27, the pixel signal extraction portion 100 extracts the first pixel signal by calculating a difference between the reset level signal N1 which is obtained in Step S24 and the output signal S1 which is obtained in Step S26.

In Step S28, FD1 and FD2 are connected again. At this time, the pulse is applied to the separation wiring 16, and thus the separation transistor Tr5 is turned on. Therefore, FD1 and FD2 are connected again.

In Step S29, the charge is transferred from PD. At this time, the pulse of the transferring wiring 15 is applied to the transfer transistor Tr1, and thus the transfer transistor Tr1 is turned on. Then, the transfer transistor Tr1 is turned off. As a result, the charges are transferred from PD to FD1 and FD2.

In Step S30, the output signal S2 is obtained.

At this time, the states of charges accumulated in PD, FD1, and FD2 are as shown in (4) of FIG. 4. In other words, the separation transistor Tr5 is turned on, and thus FD1 and FD2 are connected to each other. In addition, the transfer transistor Tr1 is turned on, and thus the charges are transferred from PD to FD1 and FD2. In this state, the output signals from FD1 and FD2, which are output to the vertical signal line 9 via the amplification transistor Tr3, are sent, as S2, to the column signal processing circuit 5.

In Step S31, the pixel signal extraction portion 100 extracts the second pixel signal by calculating the difference between the reset level signal N2 which is obtained in Step S22 and the output signal S2 which is obtained in Step S30.

In Step S32, either one of the first pixel signal which is extracted in a process of Step S27 or the second pixel signal which is extracted in a process of Step S31 is selected, and then the selected signal is output as the pixel signal of the pixel.

At this time, in the column signal processing circuit 5, for example, either one of the first pixel signal or the second pixel signal is selected by the selection portion (not illustrated) which is provided in, for example, a subsequent-stage of the pixel signal extraction portion 100, and then the selected signal is output. When, for example, the value of the first pixel signal is lower than the predetermined threshold value, the first pixel signal is selected and output. When the value of the first pixel signal is not lower than the predetermined threshold value, the second pixel signal is selected and output.

A pixel signal output process is performed as described above. However, the pixel signal output process is not limited thereto. Both the first pixel signal and the second pixel signal may be output. Alternatively, the first pixel signal and the second pixel signal may be combined into one signal and the combined signal may be output.

In the above example, the floating diffusion portion is divided into two portions (FD1 and FD2). However, the technology can be applied to an example in which the floating diffusion portion is divided into three portions (FD1, FD2, and FD3).

In other words, it is obvious that the same driving can be performed by reading out the signal three times such that the charge does not remain in PD. That is, a reset level signal N3 is read out in a state where FD1 to FD3 are connected and the reset level signal N2 and reset level signal N1 are read out in order. Then, the output signal S1, the output signal S2 and an output signal S3 are read out in order. Subsequently, reset noise may be removed by a difference between N3 and S3, reset noise may be removed by a difference between N2 and S2, and reset noise may be removed by a difference between N1 and S1.

In a similar way, the technology can be applied to an example in which the floating diffusion portion is divided into four or more portions.

An application of the technology is not limited to a solid-state imaging element, such as a CMOS image sensor. That is, the technology can be applied to general electronic devices in which solid-state imaging elements are used in an image capturing portion (a photoelectric conversion portion), for example, an imaging apparatus such as a digital still camera and a video camera, a mobile terminal device having an imaging function, and a copying machine in which a solid-state imaging element is used in an image reading portion. A solid-state imaging element may have a one-chip configuration or may have a configuration in which a plurality of chips are laminated on each other or are disposed to be adjacent to each other. A solid-state imaging element may have a module shape in which an imaging portion and a signal processing portion or an optical system are packaged and which has an imaging function.

Figure 9:
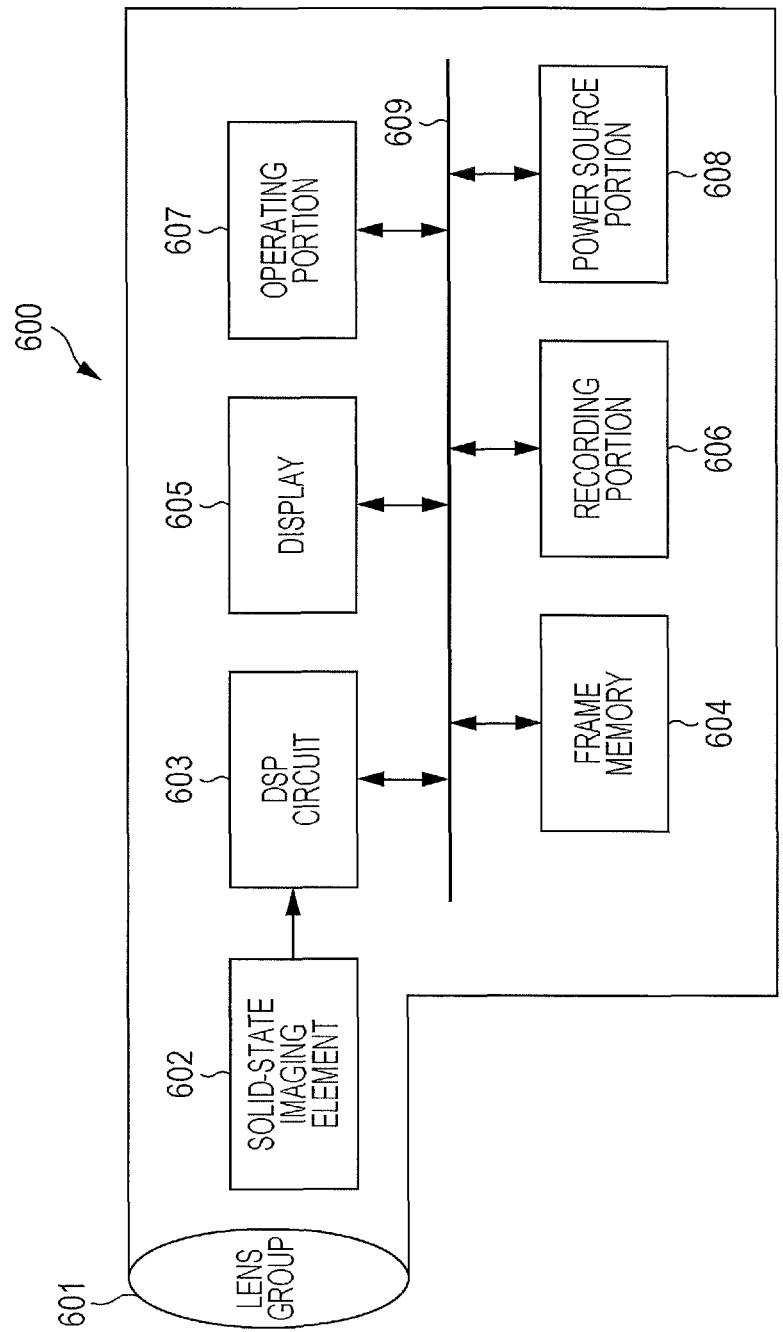
FIG. 9 is a view illustrating a configurational example of an embodiment of an electronic device to which the technology is applied.

FIG. 9 is a block diagram illustrating a configurational example of an imaging apparatus as an electronic device to which the technology is applied.

An imaging apparatus 600 of FIG. 9 includes an optical portion 601 which is constituted by a lens group or the like, a solid-state imaging element (an imaging device) 602 to which the configuration of the pixel 2 described above is applied, and a DSP circuit 603 which is a camera signal processing circuit. In addition, the imaging apparatus 600 includes a frame memory 604, a display 605, a recording portion 606, an operating portion 607, and a power source portion 608. The DSP circuit 603, the frame memory 604, the display 605, the recording portion 606, the operating portion 607, and the power source portion 608 are connected to one another through a bus line 609.

The optical portion 601 captures incident light beams (image light beams) from an object and forms an image on an imaging surface of the solid-state imaging element 602. The solid-state imaging element 602 converts the amount of incident light beams which form an image on the imaging surface by the optical portion 601, into electric signals pixel by pixel. Then, the solid-state imaging element 602 outputs the electric signals as a pixel signal. A solid-state imaging element, such as the CMOS image sensor 1 according to the embodiment described above, that is, a solid-state imaging element which can perform imaging without distortion through global exposure, can be used as the solid-state imaging element 602.

The display 605 is constituted by a panel type display device, such as a liquid crystal panel and an organic Electro Luminescence (EL) panel. The display 605 shows a moving image or a still image which is imaged by the solid-state imaging element 602. The recording portion 606 records the moving image or the still image which is imaged by the solid-state imaging element 602, in a recording medium, such as a video tape and a Digital Versatile Disc (DVD).

The operating portion 607 sends operation commands related to various functions of the imaging apparatus 600, based on an operation of a user. The power source portion 608 appropriately supplies various power sources, which are operation power sources of the DSP circuit 603, the frame memory 604, the display 605, the recording portion 606 and the operating portion 607, to the supply targets.

The CMOS image sensor 1 according to the embodiment described above is used as the solid-state imaging element 602, and thus it is possible to accurately remove the reset noise, without performing the addition of the signal, in both cases of when the first pixel signal is extracted and when the second pixel signal is extracted, as described above. Accordingly, it is possible to achieve a high quality of the image captured by the imaging apparatus 600 which is mounted in, for example, a video camera, a digital still camera, or a camera module for a mobile device, such as a mobile phone.

Furthermore, in the embodiment described above, a case in which a CMOS image sensor is used is exemplified, in which the CMOS image sensor is constituted by unit pixels that detect signal charges corresponding to the amount of visible light beams, as physical quantities and are arranged in rows and columns. However, the technology is not limited to the application to the CMOS image sensor. The technology can be applied to general column-type solid-state imaging elements in which column processing portions are provided for each pixel row of a pixel array portion.

In addition, the application of the technology is not limited to a solid-state imaging element which detects distribution of the amount of incident visible light beams and captures it as an image. The technology can be applied to a solid-state imaging element which captures, as an image, distribution of the amount of incident infrared beams, X-rays, of particles. Furthermore, in a broader sense, the technology can be applied to general solid-state imaging elements (physical quantity distribution detecting devices), such as a fingerprint detecting sensor, which detect distribution of other types of physical quantities, such as pressure and an electrostatic capacity, and capture it as an image.

The embodiments of the technology are not limited to the embodiments described above and various modifications can be made as long as they do not depart from the scope of the technology.

Furthermore, the technology can also have configurations as described below.

(1)

A solid-state imaging element including:

a pixel area in which a plurality of pixels are aligned, wherein the pixel includes:
    a photoelectric conversion portion which performs photoelectric conversion;
    a transmission portion which transfers a charge from the photoelectric conversion portion;
    a plurality of detection portions which detect the charge transferred by the transmission portion;
    a reset portion which resets the plurality of detection portions;
    a connection/separation control portion which controls connection and separation of the plurality of the detection portions; and
    an output portion which outputs a signal corresponding to potential of the detection portion, wherein, in a state where the connection/separation control portion connects the plurality of detection portions, the output portion outputs a connection-state reset level signal and a connection-state output signal and, in a state where the connection/separation control portion separates the plurality of detection portions, the output portion outputs a separation-state reset level signal and a separation-state output signal, and wherein a first pixel signal is generated by a difference between the connection-state reset level signal and the connection-state output signal and a second pixel signal is generated by a difference between the separation-state reset level signal and the separation-state output signal.

(2)

The solid-state imaging element disclosed in (1), wherein either one of the first pixel signal or the second pixel signal is selected based on a level of the first pixel signal, and wherein the selected first pixel signal or the selected second pixel signal is output as a pixel signal related to the pixel.

(3)

The solid-state imaging element disclosed in (1) or (2), wherein the pixels are aligned in a two-dimensional matrix shape, and wherein a difference of signals which are output from the output portion is calculated by a difference calculation portion which is arranged to correspond to each row of the pixels.

(4)

The solid-state imaging element disclosed in any one of (1) to (3), wherein the pixels are aligned in a two-dimensional matrix shape, and wherein a difference of signals which are output from the output portion is calculated by a difference calculation portion which is arranged to correspond to each row of the pixels and is constituted by a Correlated Double Sampling (CDS) circuit having a sample holder.

(5)

The solid-state imaging element disclosed in any one of (1) to (3), wherein the pixels are aligned in a two-dimensional matrix shape, and wherein a difference of signals which are output from the output portion is calculated by a difference calculation portion which is arranged to correspond to each row of the pixels and has a latch circuit that holds the connection-state reset level signal, the separation-state reset level signal, the separation-state output signal, and the connection-state output signal.

(6)

The solid-state imaging element disclosed in any one of (1) to (3), wherein the pixels are aligned in a two-dimensional matrix shape, and wherein a difference of signals which are output from the output portion is calculated by a difference calculation portion which is arranged to correspond to each row of the pixels and has a first up/down counter that counts a level of the connection-state reset level signal in one direction and counts a level of the connection-state output signal in the other direction and a second up/down counter that counts a level of the separation-state reset level signal in one direction and counts a level of the separation-state output signal in the other direction.

(7)

A driving method of a solid-state imaging element that has a pixel area in which a plurality of pixels are aligned, in which the pixel includes a photoelectric conversion portion which performs photoelectric conversion, a transmission portion which transfers a charge from the photoelectric conversion portion, a plurality of detection portions which detect the charge transferred by the transmission portion, a reset portion which resets the plurality of detection portions, a connection/separation control portion which controls connection and separation of the plurality of the detection portions, and an output portion which outputs a signal corresponding to potential of the detection portion, wherein, in a state where the connection/separation control portion connects the plurality of detection portions, the output portion outputs a connection-state reset level signal and a connection-state output signal and, in a state where the connection/separation control portion separates the plurality of detection portions, the output portion outputs a separation-state reset level signal and a separation-state output signal, and wherein a first pixel signal is generated by a difference between the connection-state reset level signal and the connection-state output signal and a second pixel signal is generated by a difference between the separation-state reset level signal and the separation-state output signal.

(8)

An electronic device including:

a solid-state imaging element which has a pixel area in which a plurality of pixels are aligned, wherein the pixel includes:
  a photoelectric conversion portion which performs photoelectric conversion;
  a transmission portion which transfers a charge from the photoelectric conversion portion;
  a plurality of detection portions which detect the charge transferred by the transmission portion;
  a reset portion which resets the plurality of detection portions;
  a connection/separation control portion which controls connection and separation of the plurality of the detection portions; and
  an output portion which outputs a signal corresponding to potential of the detection portion, wherein, in a state where the connection/separation control portion connects the plurality of detection portions, the output portion outputs a connection-state reset level signal and a connection-state output signal and, in a state where the connection/separation control portion separates the plurality of detection portions, the output portion outputs a separation-state reset level signal and a separation-state output signal, and wherein a first pixel signal is generated by a difference between the connection-state reset level signal and the connection-state output signal and a second pixel signal is generated by a difference between the separation-state reset level signal and the separation-state output signal.

REFERENCE SIGNS LIST

1 CMOS image sensor
2 pixel
3 pixel area
4 vertical drive circuit
5 column processing circuit
7 output circuit
8 control circuit
9 vertical signal line
11 semiconductor substrate
12 input/output terminal
100 pixel signal extraction portion
101 ADC/CDS portion
102 sample holder portion
111 ADC portion
112-1 to 112-4 latch circuit
113-1, 113-2 difference calculation portion
121 comparator
122-1, 122-2 up/down counter

The invention claimed is:

1. A solid-state imaging element comprising:

a pixel area in which a plurality of pixels are aligned in a two-dimensional matrix shape; and pixel signal extraction circuitry including a difference calculation portion which is arranged to correspond to each row of the pixels and has a first latch circuit, a second latch circuit, a third latch circuit, and a fourth latch circuit, wherein a respective pixel of the plurality of pixels includes:
  a photoelectric conversion portion configured to perform photoelectric conversion;
  a transmission portion configured to transfer a charge from the photoelectric conversion portion;
  a plurality of detection portions configured to detect the charge transferred by the transmission portion;

a reset portion configured to reset the plurality of detection portions;

a connection/separation control portion configured to control connection and separation of the plurality of the detection portions; and an output portion configured to output a signal corresponding to a potential of the plurality of detection portions, wherein, in a state where the connection/separation control portion connects the plurality of detection portions, the output portion outputs a connection-state reset level signal and a connection-state output signal and, in a state where the connection/separation control portion separates the plurality of detection portions, the output portion outputs a separation-state reset level signal and a separation-state output signal, wherein, in the digital domain, the first latch circuit is configured to store the connection-state reset level signal, the fourth latch circuit is configured to store the connection-state output signal, the second latch circuit is configured to store the separation-state reset level signal, and the third latch circuit is configured to store the separation-state output signal, wherein the difference calculation portion is configured to calculate a difference between the connection-state reset level signal and the connection-state output signal in the digital domain so as to generate a first pixel signal, and to calculate a difference between the separation-state reset level signal and the separation-state output signal in the digital domain so as to generate a second pixel signal, wherein the plurality of detection portions includes a first detection portion configured to receive the charge from the photoelectric conversion portion via the transmission portion at a first time, and a second detection portion configured to receive the charge from the photoelectric conversion portion via the transmission portion, the first detection portion, and the connection/separation control portion, in this order, at a second time after the first time, wherein the photoelectric conversion portion, the first detection portion, and the second detection portion are disposed in series, wherein either one of the first pixel signal or the second pixel signal is selected based on a level of the first pixel signal, wherein the selected first pixel signal or the selected second pixel signal is output as a respective pixel signal related to the corresponding pixel on a pixel-by-pixel basis for each of the plurality of pixels, and wherein the second latch circuit and the third latch circuit are disposed between the first latch circuit and the fourth latch circuit.

2. The solid-state imaging device according to claim 1, wherein the photoelectric conversion portion is a photodiode.

3. The solid-state imaging device according to claim 1, wherein the transmission portion is a first transistor, the reset portion is a second transistor, the connection/separation control portion is a third transistor, and the output portion is a fourth transistor.

4. The solid-state imaging device according to claim 1, wherein a capacity of the second detection portion is approximately 2 times to 20 times a capacity of the first detection portion.

5. An electronic device comprising:

a solid-state imaging element which comprises a pixel area in which a plurality of pixels are aligned in a two-dimensional matrix shape and pixel signal extraction circuitry including a difference calculation portion which is arranged to correspond to each row of the pixels and has a first latch circuit, a second latch circuit, a third latch circuit, and a fourth latch circuit, wherein a respective pixel of the plurality of pixels includes:

a photoelectric conversion portion configured to perform photoelectric conversion;

a transmission portion configured to transfer a charge from the photoelectric conversion portion;

a plurality of detection portions configured to detect the charge transferred by the transmission portion;

a reset portion configured to reset the plurality of detection portions;

a connection/separation control portion configured to control connection and separation of the plurality of the detection portions; and an output portion configured to output a signal corresponding to a potential of the plurality of detection portions, wherein, in a state where the connection/separation control portion connects the plurality of detection portions, the output portion outputs a connection-state reset level signal and a connection-state output signal and, in a state where the connection/separation control portion separates the plurality of detection portions, the output portion outputs a separation-state reset level signal and a separation-state output signal, wherein, in the digital domain, the first latch circuit is configured to store the connection-state reset level signal, the fourth latch circuit is configured to store the connection-state output signal, the second latch circuit is configured to store the separation-state reset level signal, and the third latch circuit is configured to store the separation-state output signal, wherein the difference calculation portion is configured to calculate a difference between the connection-state reset level signal and the connection-state output signal in the digital domain so as to generate a first pixel signal, and to calculate a difference between the separation-state reset level signal and the separation-state output signal in the digital domain so as to generate a second pixel signal, wherein the plurality of detection portions includes a first detection portion configured to receive the charge from the photoelectric conversion portion via the transmission portion at a first time, and a second detection portion configured to receive the charge from the photoelectric conversion portion via the transmission portion, the first detection portion, and the connection/separation control portion, in this order, at a second time after the first time, wherein the photoelectric conversion portion, the first detection portion, and the second detection portion are disposed in series, wherein either one of the first pixel signal or the second pixel signal is selected based on a level of the first pixel signal, wherein the selected first pixel signal or the selected second pixel signal is output as a respective pixel signal related to the corresponding pixel on a pixel-by-pixel basis for each of the plurality of pixels, and wherein the second latch circuit and the third latch circuit are disposed between the first latch circuit and the fourth latch circuit.

\* \* \* \* \*